United States Patent
Zhou et al.

(10) Patent No.: US 11,855,411 B2
(45) Date of Patent: Dec. 26, 2023

(54) NANOBEAM CAVITIES HAVING CARRIER-INJECTION BEAMS

(71) Applicant: Board of Regents, The University of Texas System, USAustin, TX (US)

(72) Inventors: Weidong Zhou, Southlake, TX (US); Xiaochen Ge, Sugar Land, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 190 days.

(21) Appl. No.: 17/369,789

(22) Filed: Jul. 7, 2021

(65) Prior Publication Data

US 2022/0013977 A1    Jan. 13, 2022

Related U.S. Application Data

(60) Provisional application No. 63/049,049, filed on Jul. 7, 2020.

(51) Int. Cl.
| | |
|---|---|
| *H01S 3/08* | (2023.01) |
| *H01S 5/042* | (2006.01) |
| *H01S 5/026* | (2006.01) |
| *H01S 5/10* | (2021.01) |
| *H01S 5/11* | (2021.01) |
| *H01S 5/12* | (2021.01) |

(52) U.S. Cl.
CPC ............ *H01S 5/0424* (2013.01); *H01S 5/026* (2013.01); *H01S 5/1021* (2013.01); *H01S 5/1042* (2013.01); *H01S 5/1067* (2013.01); *H01S 5/11* (2021.01); *H01S 5/12* (2013.01)

(58) Field of Classification Search
CPC ...... H01S 5/0424; H01S 5/026; H01S 5/1021; H01S 5/1042; H01S 5/1067; H01S 5/11; H01S 5/12
See application file for complete search history.

(56) References Cited

U.S. PATENT DOCUMENTS

| | | | | |
|---|---|---|---|---|
| 7,603,016 | B1* | 10/2009 | Soref | B82Y 20/00 |
| | | | | 385/129 |
| 2015/0293302 | A1* | 10/2015 | Czornomaz | H01S 5/026 |
| | | | | 438/31 |
| 2017/0229843 | A1* | 8/2017 | Ma | H01S 3/0632 |
| 2021/0184428 | A1* | 6/2021 | Noguchi | H01S 5/1021 |

* cited by examiner

*Primary Examiner* — Kinam Park
(74) *Attorney, Agent, or Firm* — Thomas Horstemeyer, LLP

(57) ABSTRACT

In one embodiment, a nanobeam cavity device includes an elongated waveguide having a central optical cavity, first and second lateral substrates that are positioned on opposed lateral sides of the waveguide, and carrier-injection beams that extend from the first and second lateral substrates to the central optical cavity of the elongated waveguide.

19 Claims, 9 Drawing Sheets

W2: width of wide fins region
W1: width of narrow fins region
LT2: length from nanobeam to taper end position.
LT1: length of narrow fins region
Taper length (TL)=LT2-LT1

NANOBEAM CAVITIES HAVING CARRIER-INJECTION BEAMS

CROSS-REFERENCE TO RELATED APPLICATION

This application claims priority to U.S. Provisional Application Ser. No. 63/049,049, filed Jul. 7, 2020, which is hereby incorporated by reference herein in its entirety.

STATEMENT REGARDING FEDERALLY SPONSORED RESEARCH

This invention was made with government support under grant no. FA9550-16-0010 awarded by the Air Force Office of Scientific Research (AFOSR). The government has certain rights in the invention.

BACKGROUND

Optical cavities are the foundation of a range of optical devices that are based on resonances. Such cavities are often used in lasers, modulators, detectors, optical sensors, as well as various types of light-matter interactions for quantum computing and sensing.

The nanophotonic nanobeam cavity is a type of photonic crystal cavity that utilizes the one-dimensional periodicity of a planar waveguide. In the direction of periodicity, a one-dimensional photonic band gap is created and small defects can be formed by modulating the structure of the unit cell. The defects can be used to confine light by refractive index guiding, and resonant modes can be supported through this confinement. Nanobeam cavities are desirable for various applications due to their capability of achieving a high quality (Q) factor, small mode volume, and small footprint.

While nanobeam cavities are highly useful in a variety of applications, they have some significant drawbacks. Typically, the optical cavity is isolated from the sides of the waveguide for strong lateral confinement. Because of this, carrier injections must be performed at the ends of the waveguide. As many periods are needed for achieving strong confinement, the carriers must travel a long distance along the waveguide to reach the active region in the defect of the cavity. This reduces the injection efficiency and generates unwanted heat. In addition, excessive carriers in the waveguide region can cause significant free-carrier absorption in the semiconductor material of the waveguide, which reduces the quality factor of the cavity and, therefore, degrades the performance of the device. It is also noted that, in some cases, the waveguide that forms the nanobeam cavity is suspended in air to improve the vertical confinement by utilizing the refractive index difference between the semiconductor material of the waveguide and the air. In this case, mechanical and thermal problems often arise that interfere with beneficial use of the nanobeam cavity.

In view of the above discussion, it can be appreciated that it would be desirable to have a nanobeam cavity that avoids one or more of the problems associated with conventional nanobeam cavities.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, it would be desirable to have a nanobeam cavity that avoids one or more of the problems associated with conventional nanobeam cavities discussed above. Disclosed herein are examples of nanobeam cavity devices that overcome several of those problems. In some embodiments, the nanobeam cavity device comprises an elongated semiconductor-based waveguide that is suspended in air at each of its opposed ends. One or more lateral carrier-injection beams extend to the waveguide and connect thereto at a central region of the waveguide at which the optical cavity is formed. The carrier-injection beams are narrow, having a width that is smaller than the wavelength of the light that is injected into the waveguide and much smaller than the dimensions of the waveguide itself. The beams serve multiple purposes. First, the beams provide structural support to the suspended waveguide. Second, the beams can be used for lateral carrier injection directly into the optical cavity. Third, the beams assist with the dissipation of heat generated within the waveguide.

In the following disclosure, various specific embodiments are described. It is to be understood that those embodiments are example implementations of the disclosed inventions and that alternative embodiments are possible. Such alternative embodiments include hybrid embodiments that include features from different disclosed embodiments. All such embodiments are intended to fall within the scope of this disclosure.

Disclosed herein are new designs of nanophotonic optical cavities or, as referred to herein, nanobeam cavity devices, with potential applications for integrated semiconductor lasers and optical sensors for optical integration. By incorporating one or more optimally designed carrier-injection beams on the lateral sides of the waveguide of the nanobeam cavity device, efficient lateral carrier injection is feasible without decreasing the quality (Q) factor. Such decoupling of the optical and carrier paths enables extremely energy efficient operation for devices such as optical cavity-based lasers.

Figure 1A:
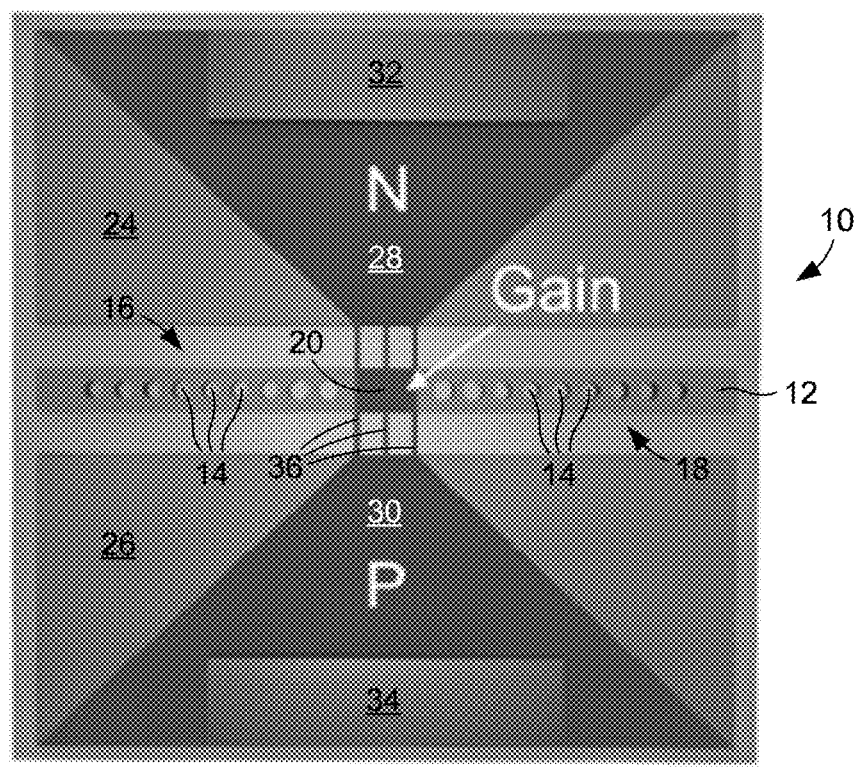
FIG. 1A is a plan view of an embodiment of a nanobeam cavity device having carrier-injection beams.
Figure 1B:
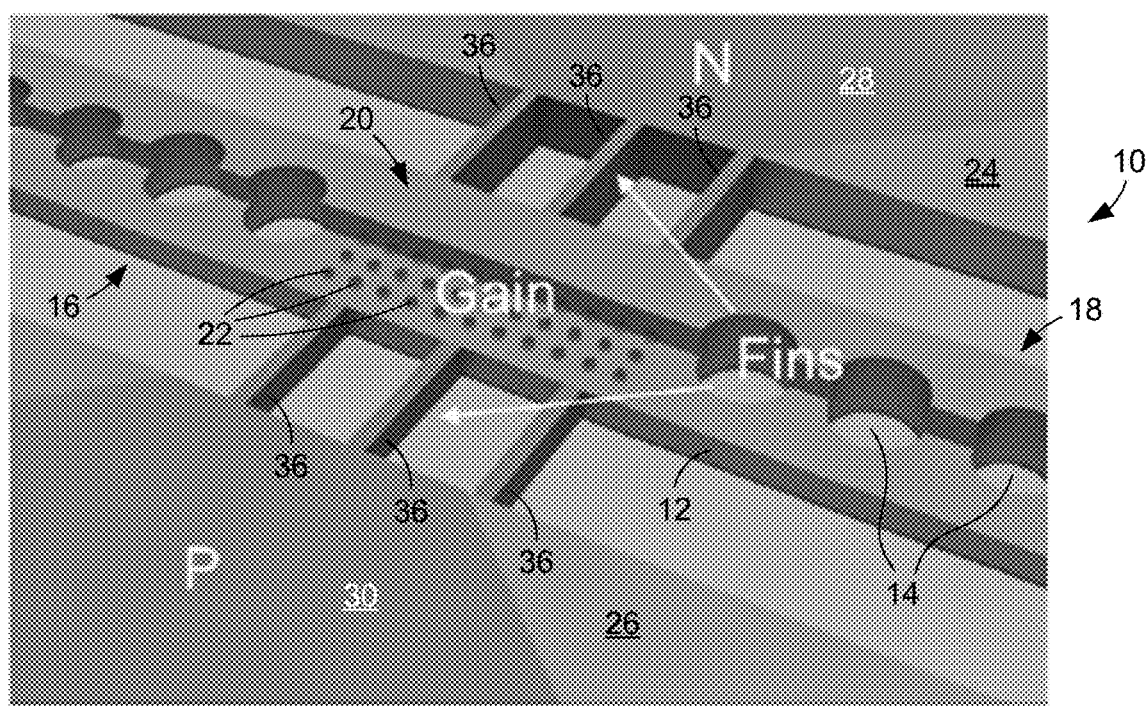
FIG. 1B is a perspective detail view of a central optical cavity of the nanobeam cavity device of FIG. 1A.

FIGS. 1A and 1B illustrate an embodiment of a nanobeam cavity device 10 that is configured as a quantum dot laser. Notably, a laser is illustrated as an example only. The nanobeam cavity devices of this disclosure are not limited to any particular application. As shown in the figures, the nanobeam cavity device 10 includes a one-dimensional planar waveguide 12 that is made of a semiconductor material, such as silicon nitride. The waveguide 12 is elongated and has a generally rectangular cross-section. In the illustrated embodiment, the waveguide 12 has a width dimension that is greater than its height dimension. By way of example, the waveguide 12 can have a width of approximately 200 to 2,000 nm and a height of approximately 100 to 500 nm. As is apparent in the figures, the waveguide 12 is suspended, which, in the context of this disclosure, means that the waveguide is surrounded on all sides by air and only is supported at its opposed ends and by lateral carrier-injection beams that are described below.

Formed within the waveguide 12 along its length are multiple periodically spaced openings or holes 14 that extend through the waveguide from its top surface to its bottom surface. These holes 14 are "defects" that facilitate confinement of light that is injected into the waveguide 12 at either of its ends. As shown in FIG. 1A, the holes 14 are arranged in two spaced groups each having a particular periodicity. Specifically, a first group 16 of holes 14 extends from a first end of the waveguide 12 while a second group 18 of holes extends from an opposed second end of the waveguide. In some embodiments, each hole 14 has a diameter of approximately 50 to 200 nm and each hole is spaced from the next adjacent hole within its group 16, 18 by a distance of approximately 100 to 1,000 nm (center to center).

Provided in the center of the waveguide 12 between the two groups 16, 18 of holes 14 is an optical cavity 20. By way of example, the optical cavity 20 can extend along a portion of the waveguide 12 that is 200 to 2,000 nm long along the longitudinal direction of the waveguide. As shown in the cut-away of FIG. 1B, gain material can be provided within a gain region of the optical cavity 20. In the illustrated embodiment, this gain material comprises quantum dots 22 that are arranged in an array within the optical cavity 20.

The nanobeam cavity device 10 also includes opposed first and second lateral substrates 24 and 26, which can be made of a suitable dielectric material. As shown in the figure, the lateral substrates 24, 26 are doped such that the first substrate 24 is n-doped and the second substrate 26 is p-doped. In the illustrated embodiment, generally triangular doped regions 28, 30 are formed in which the "tips" of the triangles are positioned directly across from each other adjacent to the optical cavity 20 of the waveguide 12. Together, these doped regions 28, 30 form a p-n junction. Provided on each of the regions 28, 30 are electrodes 32 and 34 that are made of a suitable conductive material, such as a metal material. The electrodes 32, 34 can be used to inject carriers into the optical cavity 20 of the waveguide 12 via lateral carrier-injection beams 36.

As shown in the figures, the nanobeam cavity device 10 comprises multiple lateral carrier-injection beams 36, which also may be referred to as fins, that extend from the lateral substrates 24, 26 to the waveguide 12 and contact the waveguide at the location of a central optical cavity 20 formed by the waveguide. In the illustrated embodiment, the nanobeam cavity device 10 comprises six such carrier-injection beams 36, three on each side of the waveguide 12. Each carrier-injection beam 36 can be made of the same material as the optical cavity 20 and extends to the waveguide 12 laterally or transversely at an approximately 90 degree angle (i.e., generally perpendicular) to the longitudinal axis of the waveguide. As is clear from FIGS. 1A and 1B, the carrier-injection beams 36 of the illustrated embodiment also have generally rectangular cross-sections and are very narrow as compared to the waveguide 12. By way of example, the carrier-injection beams 36 can have width and height dimensions that are approximately 10 to 200 nm. Irrespective of their particular configurations, the carrier-injection beams 36 can be used to inject carriers (i.e., electrons and holes) into the optical cavity 20 from both sides of the waveguide 12. Therefore, the optical cavity 20 can be left undoped, which reduces absorption loss. As compared with an injection path that extends along the length of a waveguide as with conventional nanobeam cavity devices, this injection scheme provides a much shorter path (i.e., distance) that the carriers must travel before recombination, thus avoiding the issues with free carrier absorption and low efficiency.

Notably, connecting carrier-injection beams 36 to the lateral sides of the waveguide 12 could adversely impact the passive cavity Q due to reduced lateral confinement. To minimize this effect, the locations at which the carrier-injection beams 36 contact the waveguide 12 are chosen such that the electric field amplitude of the cavity's resonant mode is at a minimum at those locations. This can be achieved by (i) simulating the resonant mode on which the nanobeam cavity device 10 is based to locate the electric field minima (i.e., the nodes of the device's resonant mode), (ii) selecting the period for the carrier-injection beams 36 to be identical with that of the nanobeam cavity device so that the beams are each located at one of the nodes, and (iii) fabricating the carrier-injection beams to be as thin as possible within the limit of electrical, thermal, and mechanical requirements to minimize the impact to confinement.

Figure 2A:
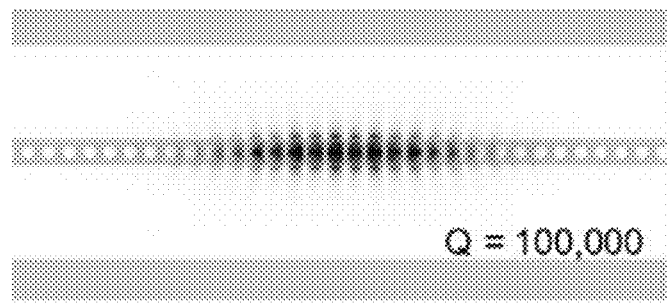
FIG. 2A illustrates the results of finite-different time-domain (FDTD)-simulated nanobeam cavity modes obtained during an investigative study for a suspended waveguide without carrier-injection beams.
Figure 2B:
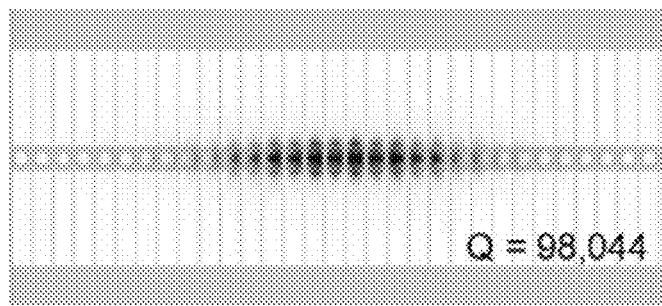
FIG. 2B illustrates the results of FDTD-simulated nanobeam cavity modes obtained during an investigative study for a suspended waveguide with carrier-injection beams.
Figure 2C:
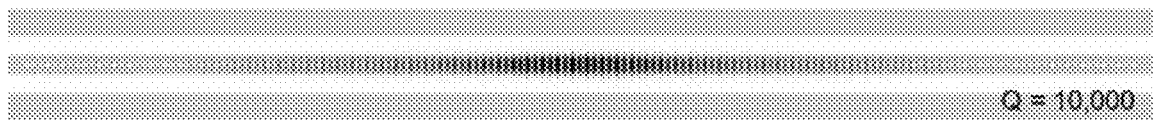
FIG. 2C illustrates the results of FDTD-simulated nanobeam cavity modes obtained during an investigative study for an on-substrate waveguide without carrier-injection beams.
Figure 2D:
FIG. 2D illustrates the results of FDTD-simulated nanobeam cavity modes obtained during an investigative study for an on-substrate waveguide with carrier-injection beams.

The effect of adding carrier-injection beams, such as beams 36, to an existing nanobeam cavity device was evaluated through simulations for on-substrate and suspended waveguides. The results of these simulations are presented in FIGS. 2A-2D. FIG. 2A illustrates the results of finite-different time-domain (FDTD)-simulated nanobeam cavity modes for a suspended waveguide without carrier-injection beams. FIG. 2B illustrates the results of FDTD-simulated nanobeam cavity modes for a suspended waveguide with carrier-injection beams. FIG. 2C illustrates the results of FDTD-simulated nanobeam cavity modes for an on-substrate waveguide without carrier-injection beams. Finally, FIG. 2D illustrates the results of FDTD-simulated nanobeam cavity modes obtained for an on-substrate waveguide with carrier-injection beams. For each case, the geometric parameters of the nanobeam cavity device remained the same, thus the only difference between the cases was the addition of the carrier-injection beams. Plotted in each figures is a snapshot of the electric field $E_y$ of the cavity resonant modes. The minima of the electric field amplitude are at the nodes where the field is close to zero. By connecting the carrier-injection beams to the waveguides at those positions, the impact to the cavity Q factor was minimized.

Figure 3A:
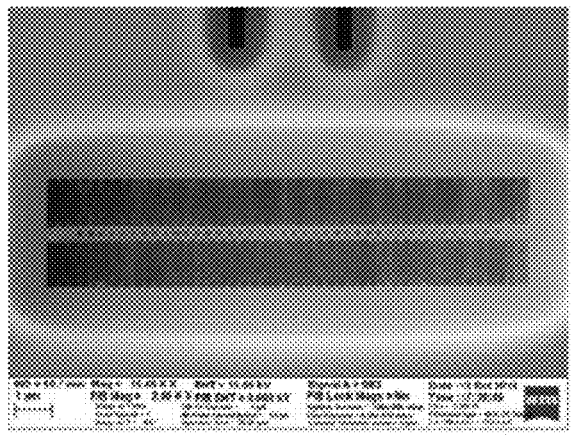
FIG. 3A is a scanning electron microscope (SEM) image of a fabricated sample of a suspended nanobeam cavity device having carrier-injection beams in plan view.
Figure 3B:
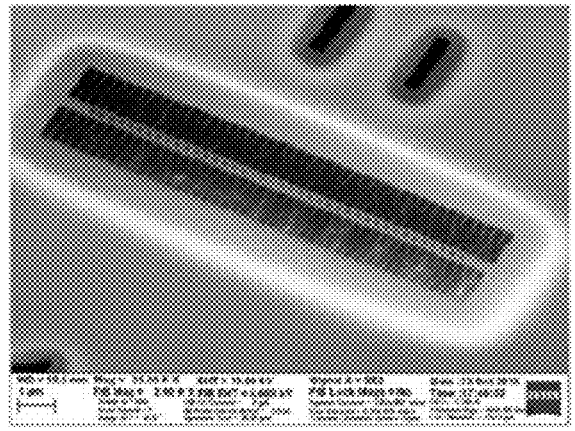
FIG. 3B is a further SEM image of the device of FIG. 3A shown in perspective view.
Figure 3C:
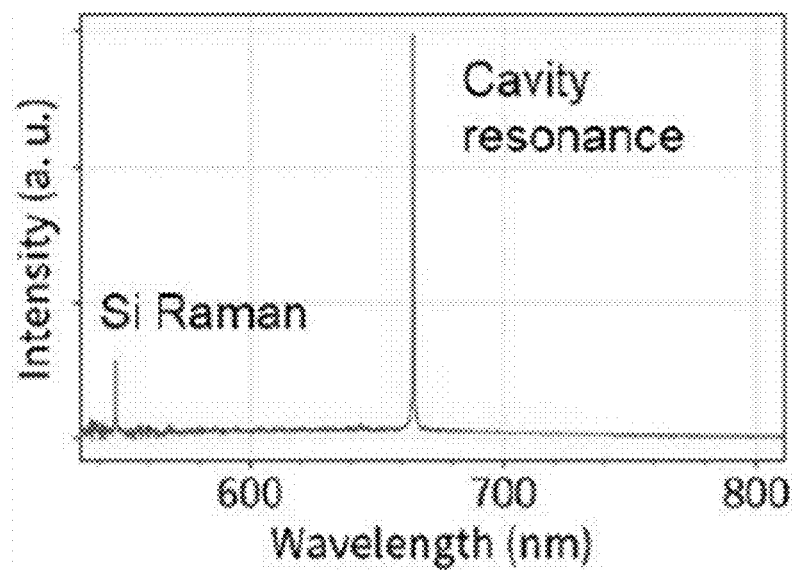
FIG. 3C is a graph that shows the measured photoluminescence (PL) spectrum for the device shown in FIGS. 3A and 3B.

A preliminary experimental study of the above-described nanobeam cavity device was also performed on suspended nanobeam cavities, as illustrated in FIGS. 3A-C. FIGS. 3A and 3B are scanning electron microscope (SEM) images of a fabricated sample of a suspended nanobeam cavity device having carrier-injection beams. FIG. 3C is a graph that shows the measured photoluminescence (PL) spectrum for the device shown in FIGS. 3A and 3B. When the waveguide was suspended, the capillary force that occurs during solvent drying after resist removal caused several of the carrier-injection beams to bend and/or break. However, most of the beams were still attached to the waveguide. Also, it is noted that the part of the carrier-injection beam that is closest to the waveguide has the greatest impact on the cavity resonant mode. Photoluminescence (PL) measurements revealed that strong resonance can still be achieved despite the presence of the carrier-injection beams and that deviation of the actual structure to the design, which is indicative of the impact, can be minimized.

It is further noted that, in addition to improving carrier injection, the carrier-injection beams also provide structural (mechanical) support and heat dissipation for the waveguide of the nanobeam cavity device. While these additional aspects are less important for on-substrate nanobeam cavities, they provide a significant benefit for suspended waveguides, such as that illustrated in FIG. 1.

In view of the above discussion, it can be concluded that nanobeam cavity devices having suspended waveguides and lateral carrier-injection beams that connect to the waveguides at their optical cavities are an improvement over conventional nanobeam cavity devices as the former facilitates lateral carrier injection directed into the optical cavity. The mechanical and thermal properties of the device are also improved. Negligible impact to the device performance is achieved by placing the beams at the electric field minima of the device's resonant mode. The disclosed nanobeam cavity device has major applications for integrated photonics in which scaling in size (integration density) and efficiency will ultimately be the determining factors in their application penetrations in data communications, computing, and consumer electronic applications.

While the disclosed nanobeam cavity devices have been described and illustrated as having a suspended waveguide, it is noted that, in other embodiments, the waveguide can be an on-substrate waveguide in which the underlying substrate has a refractive index that is lower than that of the waveguide.

Figure 4:
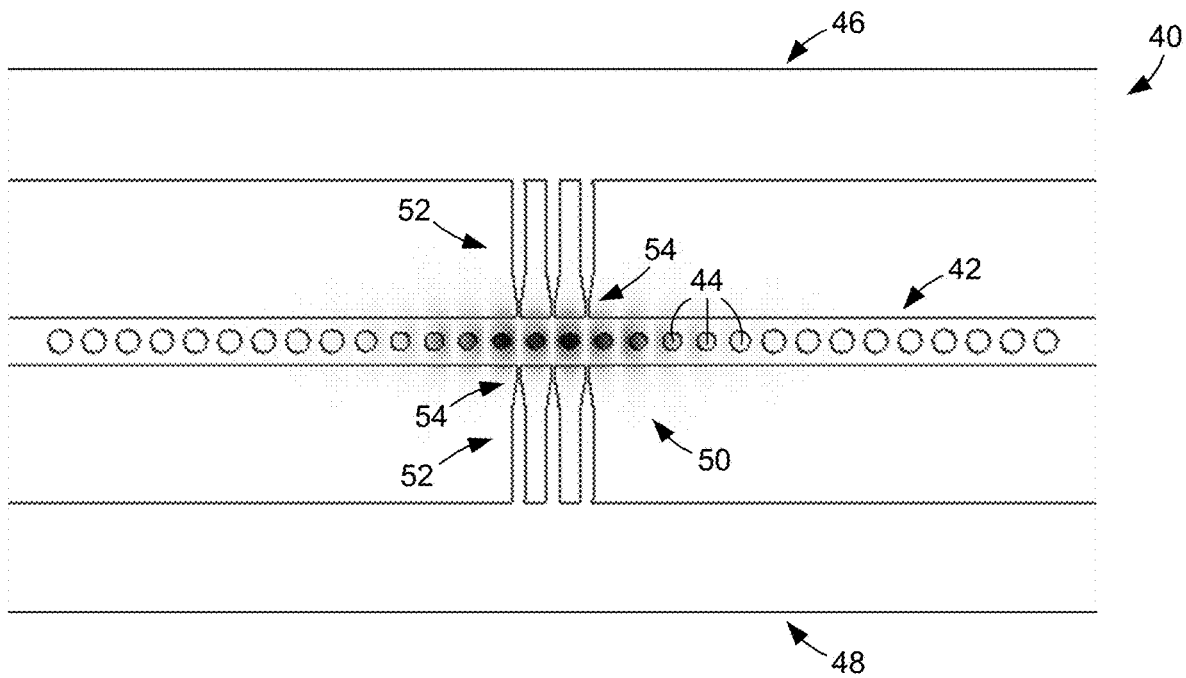
FIG. 4 is a plan view of an embodiment of a nanobeam cavity device having tapered carrier-injection beams.

Although the carrier-injection beams can have a constant cross-sectional configurations and dimensions, it is also noted that, in other embodiments, the beams can be tapered at the ends that contact or connect to the waveguide. FIG. 4 illustrates an example of such an arrangement. As with the nanobeam cavity device 10 of FIG. 1, the nanobeam cavity device 40 shown in FIG. 4 includes a suspended planar waveguide 42 having multiple periodically spaced holes 44 that are positioned between first and second lateral doped substrates 46 and 48. Provided in the center of the waveguide 12 is an optical cavity 50. Also like the device 10, the device 40 further includes multiple carrier-injection beams 52 that extend from the lateral substrates 46, 48 to the waveguide 42 at or near the location of the waveguide's central optical cavity 50. As before, the locations at which the carrier-injection beams 52 contact the waveguide 42 are chosen such that the electric field amplitude of the cavity's resonant mode is at a minimum at those locations. In this embodiment, however, each of the beams 52 is tapered at its end (tip) 54 that joins the waveguide 42 to minimize any negative impact the beams could have.

Figure 5:
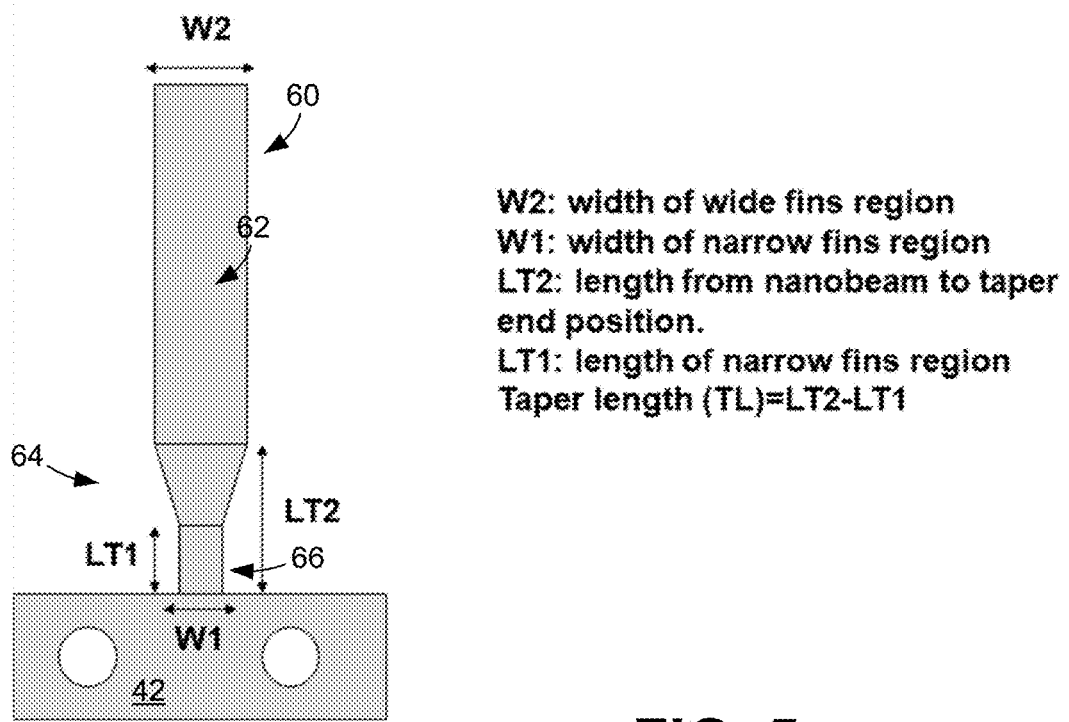
FIG. 5 is a side view of an embodiment of a tapered carrier-injection beam that can be used in a device such as that illustrated in FIG. 4.

FIG. 5 illustrates an example configuration for a tapered carrier-injection beam 60 that can be used in a nanobeam cavity device, such as the device 40. As shown in this figure, the beam 60 includes a first constant cross-section portion 62 having a constant cross-section and, therefore, width, W2. Extending from the first constant cross-section portion 62 toward the waveguide 42 is an intermediate tapered portion 64 that narrows in cross-sectional dimension as it is traversed toward the waveguide. Extending from the tapered portion 64 to the waveguide 42 is a second constant cross-section portion (or "tip") 66 that is significantly smaller in width, W1, than the width, W2, of the first constant cross-section portion 62. As with W2, W1 is constant along the length of the second constant cross-section portion 66. The second constant cross-section portion 66 has a length, LT1, while the tapered portion 64 and the second constant cross-section portion together have a length of LT2. It follows then that the tapered section 64 has a length of (LT2−LT1).

Figure 6A:
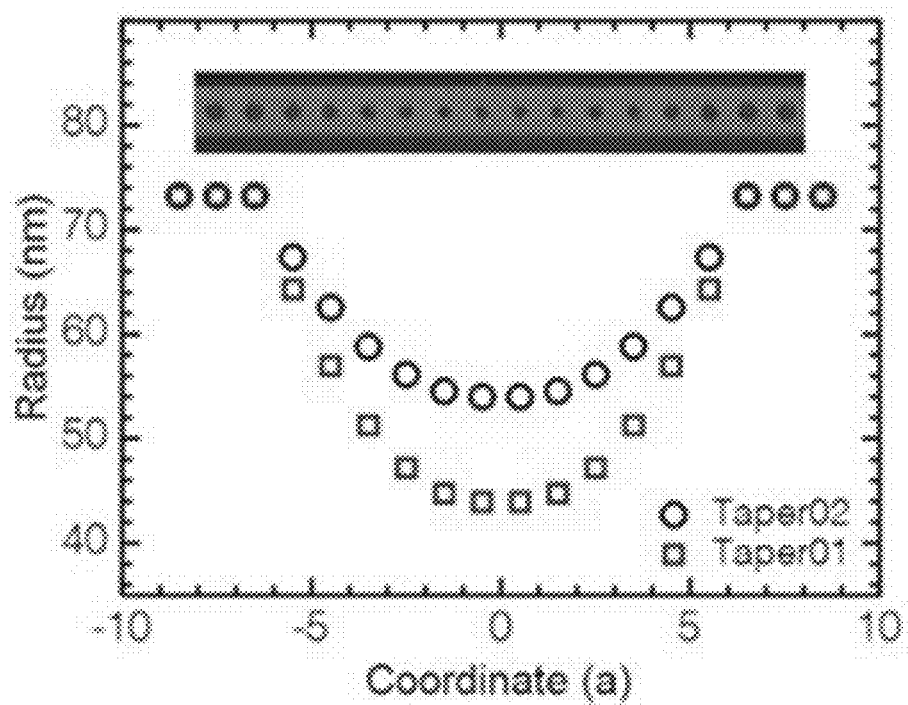
FIG. 6A is a graph that shows a designed radius taper of a nanobeam cavity device.
Figure 6B:
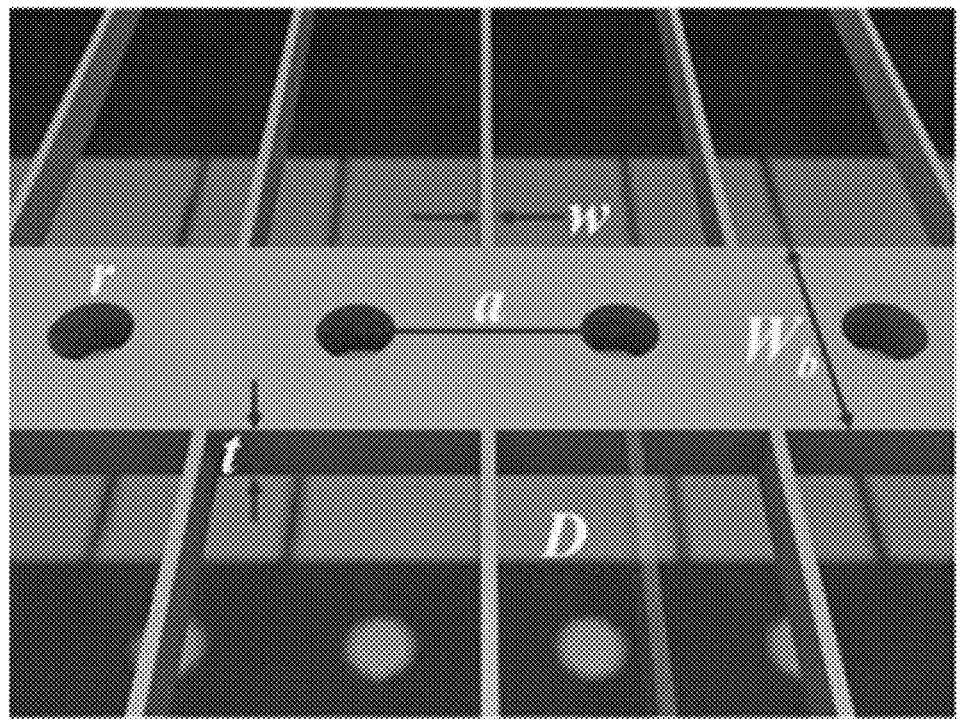
FIG. 6B is a schematic view of an optical cavity of a nanobeam cavity device and identifies key design parameters of the cavity.

It is further noted that the positions of the carrier-injection beams can be tuned to achieve a range of desired Q factor and resonance wavelength. In addition, the nanobeam cavity device can be designed to utilize the maximum mirror strength, thus it can be desirable to have a symmetric radius taper of 6 periods on each side about the center of the optical cavity according to the deterministic method. FIG. 6A is a graph that illustrates a taper of an optical cavity of a nanobeam cavity device that was fabricated. The device had a regular hole radius of 73.7 nm and two different parabolic radius tapers were fabricated with a minimum hole radius of 43.9 nm (Taper01, squares) and of 54 nm (Taper02, circles), respectively, to verify the mirror strength theory. FIG. 6B shows other key design parameters, including cavity thickness t, photonic cavity non-taper regular hole radius r, photonic cavity lattice constant a, carrier-injection beam width w, waveguide width $W_b$, and the beam alignment position D. D=0 is designated for beams aligned to the center point of two holes and D=0.5a is designated for beams aligned to the center of each hole. The optimized value for these parameters are r=74 nm, a=272 nm, w=30 nm, and $W_b$=300 nm for a resonance target wavelength of 660 nm.

The above-noted nanobeam cavity device was fabricated by stoichiometrically growing a 150 nm thick $Si_3N_4$ film using a low-pressure chemical vapor deposition (LPCVD) method at 770° C. on ap-type silicon wafer in a Tystar Tytan nitridation. furnace. The patterning of nanobeam cavity device was performed using standard electron beam (e-beam) lithography (EBL), directional reactive ion etching (RIE) of $Si_3N_4$, isotropic RIE of Si substrate, stripping, and plasma cleaning of the e-beam resist.

The EBL process started with spin coating (4000 rpm, thickness 371 nm) of e-beam resist (ZEP 520A), followed by pre-baking at 180° C. for 3 minutes, after which was the e-beam exposure under an accelerating voltage of 20 kV on the Nanometer Pattern Generation System (NPGS, by JC Nabity Lithography Systems). The exposed pattern was then developed by Amyl Acetate under refrigeration temperature for 60 seconds followed by a post-baking at 60° C. and heating up to 100° C.

Figure 7A:
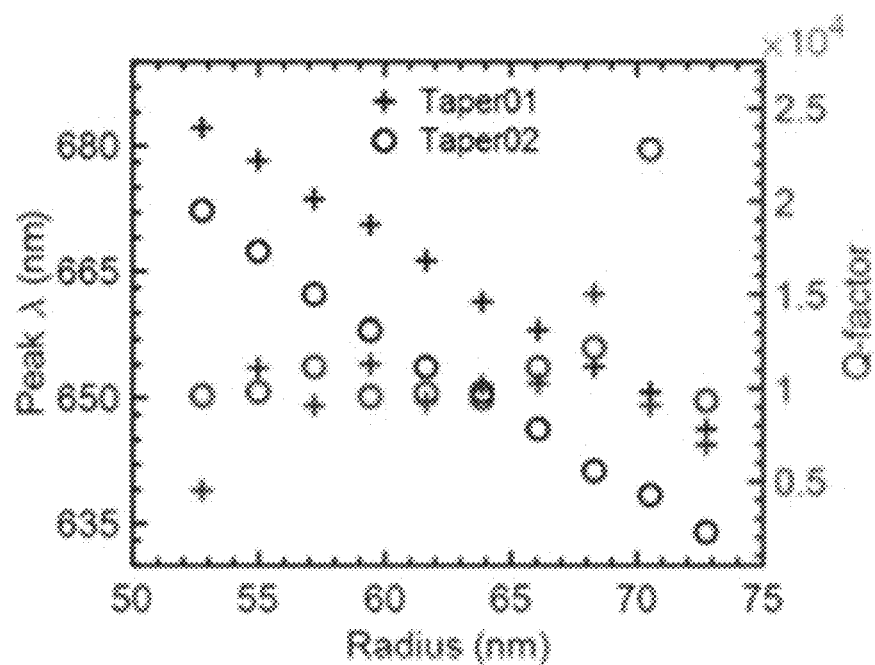
FIG. 7A is a graph that shows the measured resonance wavelength and quality (Q) factor of two different taper structures at different radius offsets.
Figure 7B:
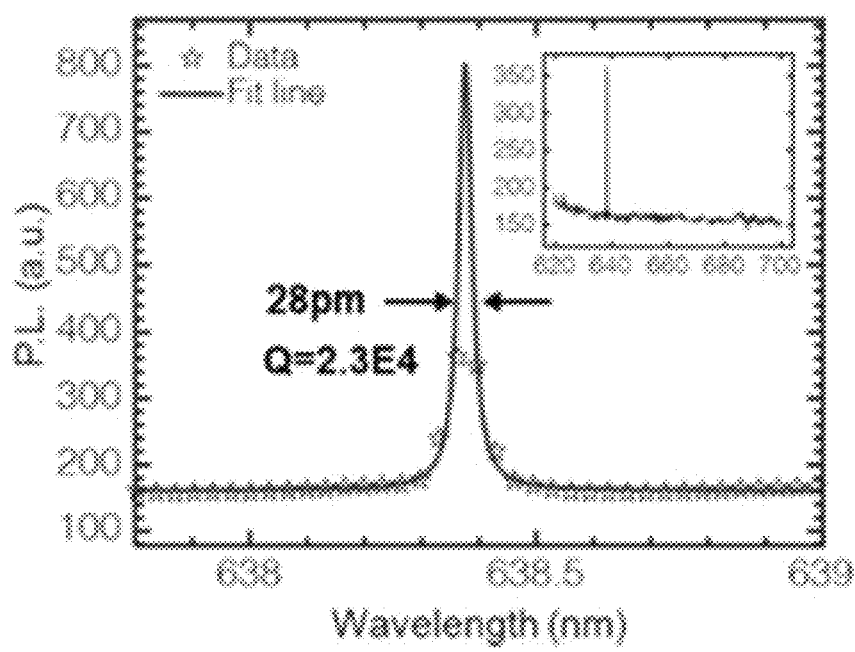
FIG. 7B is a graph that shows the measured resonance peak and its Lorentzian fitting of a nanobeam cavity device without carrier-injection beams that has a corresponding radius size to the nanobeam cavity device with carrier-injection beams.

Both a nanobeam cavity device without lateral carrier-injection beams and a nanobeam cavity device with lateral carrier-injection beams were fabricated. For the design without lateral beams, two different tapers were created and compared. The cavity resonance can be measured by optically pumping the $Si_3N_4$ cavity with a 450 nm laser to activate the defect states in the $Si_3N_4$. As shown in FIG. 7A, in a series of radius offset scan-patterned to achieve targeted device dimension, the resonance wavelength of the two tapers shifts linearly, with Q factor maximized near the optimized radius. Taper02 had a closer match of radius profile to the optimized design. FIG. 7B shows the spectrum of the cavity resonance with the optimized taper. The highest Q factor obtained was $2.3 \times 10^4$ with full width at half maximum (FWHM) of 28 pm. Shown in the inset is the full spectrum measured.

Figure 8A:
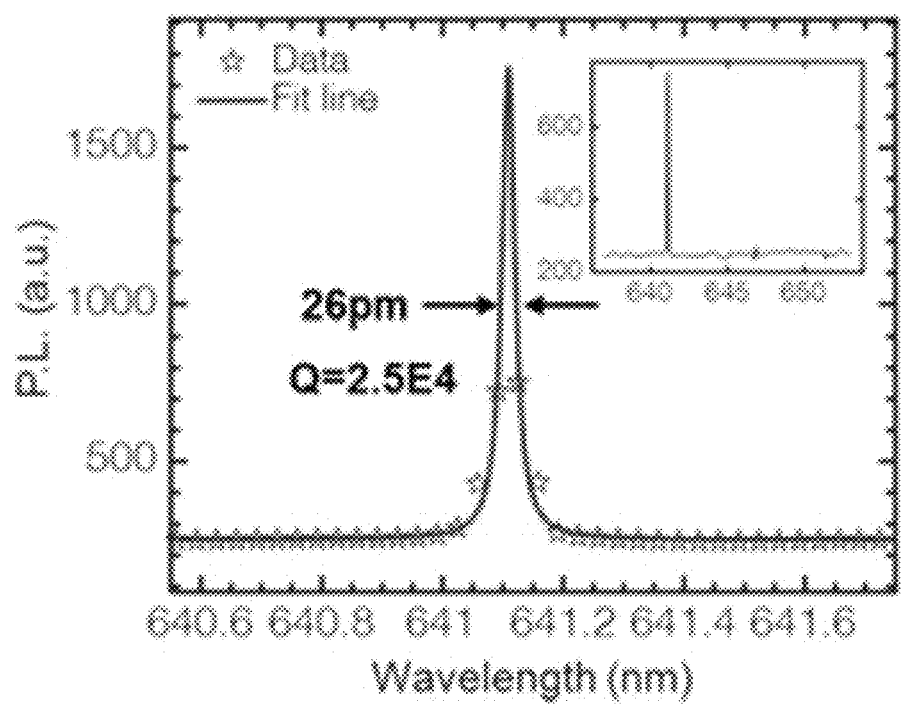
FIG. 8A is a graph that shows a measured resonance peak and its Lorentzian fitting of the nanobeam cavity device with carrier-injection beams aligned to the center of two holes.
Figure 8B:
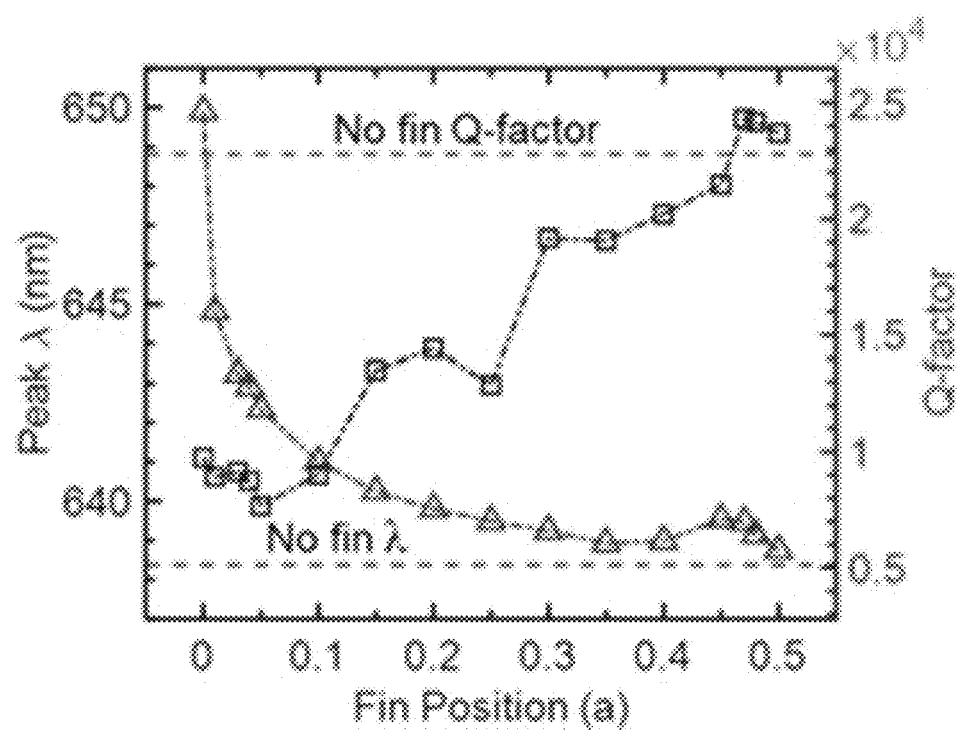
FIG. 8B is a graph that shows a measurement result of tuning the resonance wavelength and Q factor as carrier-injection beam alignment position changes, where position D=0 is when the beams are aligned to center of two holes and position D=0.5 is when the beams are aligned to holes

After confirming the cavity radius taper profile, arrays of nanobeam cavities with lateral carrier-injection beams were fabricated with beam alignment varied from the center point of 2 holes (defined as D=0) to the center of each hole (defined as D=0.5a). At D=0, the presence of the beam has minimal influence to the distribution of the electromagnetic (EM) field compared to non-beam device, as shown in the measured spectrum shown in FIG. 8A, where $Q=2.46 \times 10^4$ and FWHM=26 pm. The true Q factor can be higher since the resolution on our setup is limited to resolve finer peaks. This is close to the result shown in FIG. 7B. As the beam position shifts to the center of each hole, the EM field starts to couple to the beam, decreasing the confinement (Q factor) in the cavity and brings down the resonance frequency, as shown in measured result FIG. 8B, where the triangle line is the Q factor (resonance wavelength) of the nanobeam cavity device with the same dimensions but without the lateral carrier-injection beams.

Figure 9A:
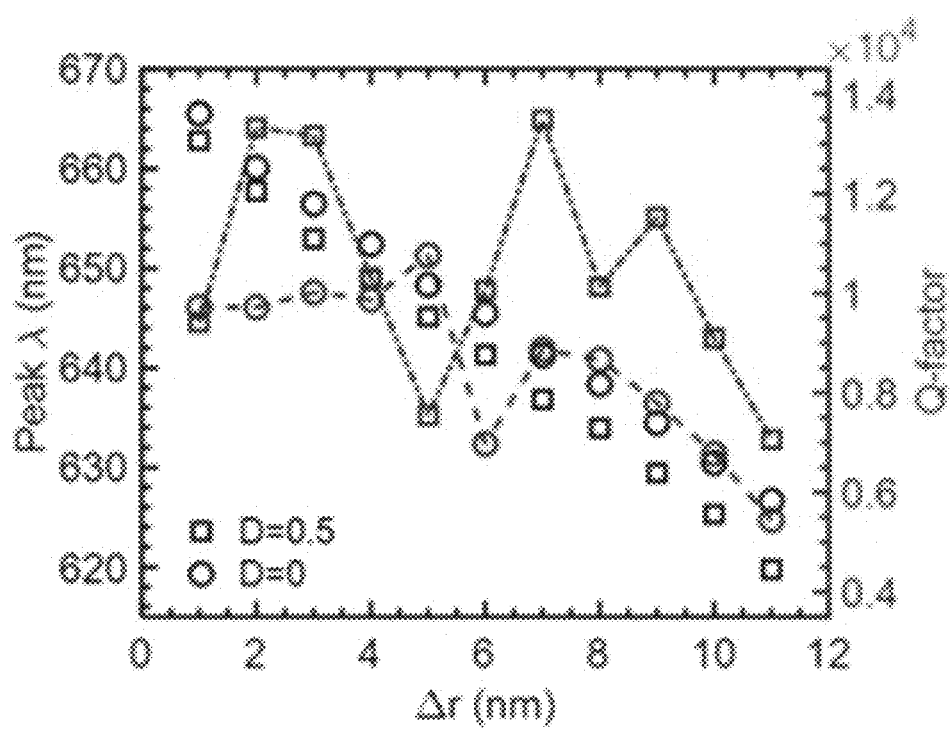
FIG. 9A is a graph that shows the measured resonance wavelength and Q factor of devices with different radius offsets.
Figure 9B:
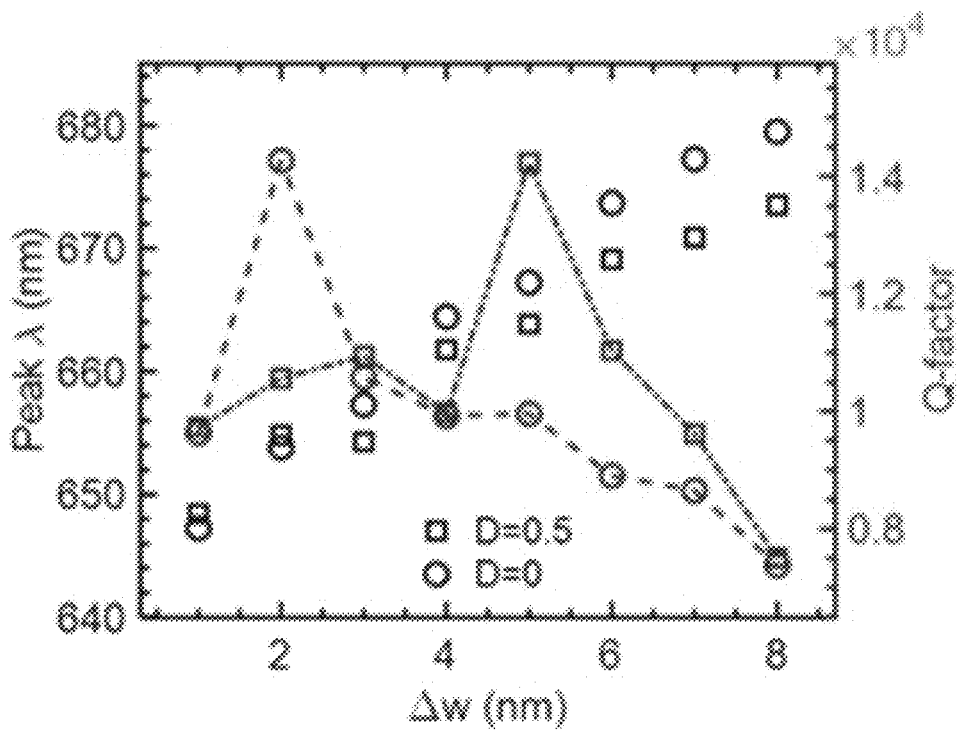
FIG. 9B is a graph that shows the measured resonance wavelength and Q factor of devices with different beam widths.
Figure 9C:
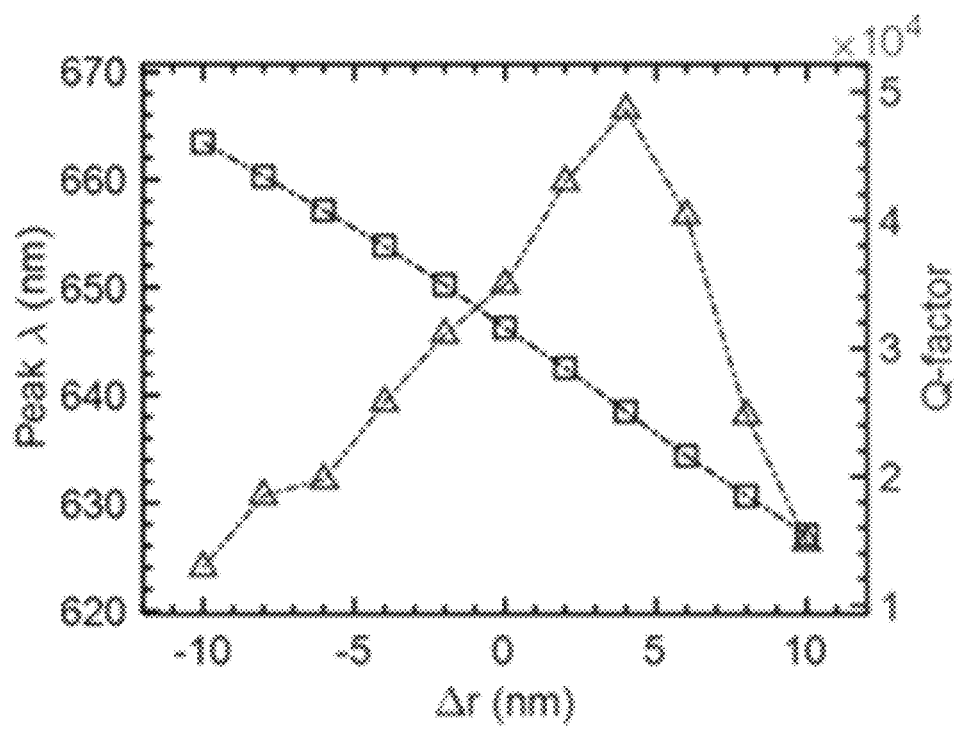
FIG. 9C is a graph that shows the simulated resonance wavelength and Q factor of devices with different radius offsets.
Figure 9D:
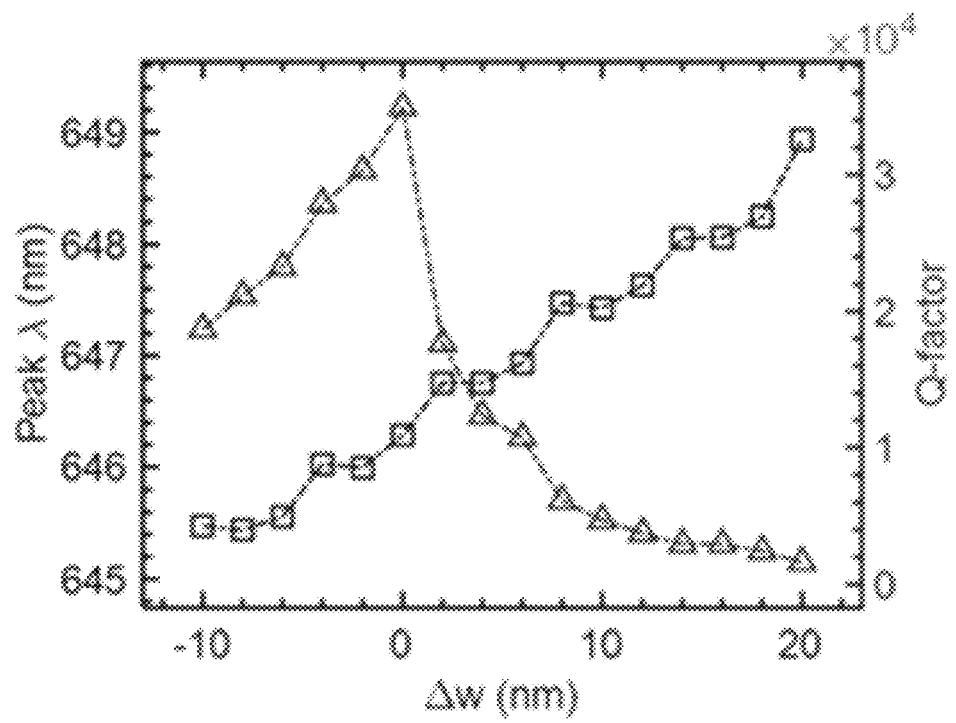
FIG. 9D is a graph that shows the simulated resonance wavelength and Q factor of devices with different beam widths.

To investigate the influence of fabrication offset on the hole radius and carrier-injection beam width, and the capability of tuning power of the beam-tuning on the nanobeam cavity device, a series of nanobeam cavity devices were fabricated where the radius and beam width offsets were scanned. As shown in the measured results shown in FIGS. 9A and 9B, both parameters have an optimized Q factor for D=0 and D=0.5 alignment. This agrees well with the numeric simulation result shown in FIGS. 9C and 9D. It is worth mentioning that the range of wavelength tuning based upon beam position increases for both larger radius and wider beams. However, the tradeoff of this broader tuning range is a much lower Q factor in both cases.

The invention claimed is:

1. A nanobeam cavity device comprising:
an elongated waveguide having a central optical cavity, the waveguide being suspended in air such that air surrounds a top, a bottom, and opposed lateral sides of the waveguide;
first and second lateral substrates that are positioned on opposed lateral sides of the waveguide; and
carrier-injection beams that extend from the first and second lateral substrates to the central optical cavity of the elongated waveguide.

2. The device of claim 1, wherein the elongated waveguide is made of a semiconductor material.

3. The device of claim 1, wherein the elongated waveguide is made of a dielectric material.

4. The device of claim 1, wherein the elongated waveguide has multiple holes that extend from a top surface of the waveguide to a bottom surface of the waveguide.

5. The device of claim 4, wherein the carrier-injection beams are each aligned with a center of one of the holes or a center between two holes.

6. The device of claim 4, wherein the holes are provided in two groups positioned on opposite sides of the central optical cavity, the holes in each group having an equal periodicity within the group.

7. The device of claim 6, wherein the holes of each group are tapered such that the holes are larger in size the farther away from the center of the central optical cavity they are positioned.

8. The device of claim 1, wherein the carrier-injection beams contact the elongated wavelength at nodes of a resonant mode of the nanobeam cavity device where the minima of an electric field generated by light injected into the elongated waveguide lie.

9. The device of claim 1, wherein there are multiple carrier-injection beams provided on each lateral side of the elongated waveguide.

10. The device of claim 1, wherein the carrier-injection beams have width and height dimensions that are smaller than a width dimension of the elongated waveguide.

11. The device of claim 1, wherein the carrier-injection beams have width and height dimensions that are smaller than a wavelength of light for which the nanobeam cavity device is designed.

12. The device of claim 1, wherein the carrier-injection beams have width and height dimensions of approximately 10 to 1,000 nm.

13. The device of claim 1, wherein the carrier-injection beams are made of semiconductor materials.

14. The device of claim 1, wherein the first and second lateral substrates are made of a dielectric material.

15. The device of claim 14, wherein the first and second lateral substrates are p-doped and n-doped, respectively, and form a p-n junction adjacent to the central optical cavity.

16. The device of claim 15, further comprising first and second electrodes that contact the p-doped and n-doped regions of the first and second lateral substrates, respectively.

17. The device of claim 1, wherein the carrier-injection beams taper at a point at which they contact the elongated waveguide.

18. The device of claim 17, wherein the carrier-injection beams include a constant cross-section portion and a tapered cross-section portion.

19. The device of claim 17, wherein the carrier-injection beams include a first constant cross-section portion, a second constant cross-section portion, and a tapered cross-section portion that is positioned between the first and second constant cross-section portions.

* * * * *